(12) United States Patent
Wagner et al.

(10) Patent No.: US 9,991,621 B2
(45) Date of Patent: Jun. 5, 2018

(54) OPTOELECTRONIC ARRANGEMENT

(71) Applicant: OSRAM Opto Semiconductors GmbH, Regensburg (DE)

(72) Inventors: Konrad Wagner, Regensburg (DE); Jürgen Holz, Wenzenbach (DE)

(73) Assignee: OSRAM Opto Semiconductors GmbH (DE)

( * ) Notice: Subject to any disclaimer, the term of this patent is extended or adjusted under 35 U.S.C. 154(b) by 133 days.

(21) Appl. No.: 14/896,420

(22) PCT Filed: May 15, 2014

(86) PCT No.: PCT/EP2014/059968
§ 371 (c)(1),
(2) Date: Dec. 7, 2015

(87) PCT Pub. No.: WO2014/202291
PCT Pub. Date: Dec. 24, 2014

(65) Prior Publication Data
US 2016/0111803 A1    Apr. 21, 2016

(30) Foreign Application Priority Data
Jun. 20, 2013 (DE) .................. 10 2013 211 640

(51) Int. Cl.
*H05K 7/00* (2006.01)
*H01R 13/405* (2006.01)
(Continued)

(52) U.S. Cl.
CPC ......... *H01R 13/405* (2013.01); *H01R 4/2404* (2013.01); *H01R 4/2479* (2013.01);
(Continued)

(58) Field of Classification Search
CPC .... H01R 12/718; H01R 13/405; H01R 24/58; H01R 4/2404; H01R 4/2479;
(Continued)

(56) References Cited

U.S. PATENT DOCUMENTS 6,252,252 B1 * 6/2001 Kunii .................. H01L 31/0203
257/433
6,717,820 B1 * 4/2004 Loh ..................... H01L 31/0203
257/E31.118
(Continued)

FOREIGN PATENT DOCUMENTS

CN    1205775    1/1999
DE    93 09 973 U1    9/1993
(Continued)

OTHER PUBLICATIONS

Notice of Reasons for Rejection dated Dec. 13, 2016, of corresponding Japanese Application No. 2016-520327 in English.
(Continued)

*Primary Examiner* — Yuriy Semenenko
(74) *Attorney, Agent, or Firm* — DLA Piper LLP (US)

(57) ABSTRACT

An optoelectronic arrangement includes a first circuit board, a second circuit board, and an optoelectronic semiconductor chip arranged on the first circuit board, wherein a first electrical contact surface and a second electrical contact surface are formed on a surface of the first circuit board, a first mating contact surface and a second mating contact surface are formed on a surface of the second circuit board, and the first circuit board and the second circuit board connect to one another such that the surface of the first circuit board faces toward the surface of the second circuit board, and the first mating contact surface electrically con-
(Continued)

ductively connects to the first contact surface and the second mating contact surface electrically conductively connects to the second contact surface.

18 Claims, 7 Drawing Sheets

(51) Int. Cl.
| | | |
|---|---|---|
| H05K 1/14 | (2006.01) | |
| H01R 4/24 | (2018.01) | |
| H01R 12/71 | (2011.01) | |
| H01R 24/58 | (2011.01) | |
| H05K 1/03 | (2006.01) | |
| H05K 1/18 | (2006.01) | |
| H05K 7/02 | (2006.01) | |
| H05K 1/05 | (2006.01) | |
| H05K 3/36 | (2006.01) | |
| H05K 3/32 | (2006.01) | |

(52) U.S. Cl.
CPC .......... *H01R 12/718* (2013.01); *H01R 24/58* (2013.01); *H05K 1/038* (2013.01); *H05K 1/0366* (2013.01); *H05K 1/141* (2013.01); *H05K 1/181* (2013.01); *H05K 7/02* (2013.01); *H05K 1/056* (2013.01); *H05K 1/144* (2013.01); *H05K 3/325* (2013.01); *H05K 3/368* (2013.01); *H05K 2201/012* (2013.01); *H05K 2201/0129* (2013.01); *H05K 2201/041* (2013.01); *H05K 2201/10106* (2013.01); *H05K 2201/10189* (2013.01); *H05K 2201/10356* (2013.01); *H05K 2201/10409* (2013.01)

(58) Field of Classification Search
CPC ...... H05K 1/0366; H05K 1/038; H05K 1/056; H05K 1/141; H05K 1/144; H05K 1/181; H05K 2201/012; H05K 2201/0129; H05K 2201/041
See application file for complete search history.

(56) References Cited

U.S. PATENT DOCUMENTS

| | | | | |
|---|---|---|---|---|
| 7,482,800 | B2* | 1/2009 | Ooyabu | H05K 3/363 |
| | | | | 174/255 |
| 7,715,666 | B2* | 5/2010 | Kodama | G02B 6/42 |
| | | | | 385/14 |
| 8,379,403 | B2* | 2/2013 | Waite | G01R 1/06772 |
| | | | | 257/726 |
| 2004/0085742 | A1* | 5/2004 | Ito | H01G 2/06 |
| | | | | 361/782 |
| 2011/0140136 | A1 | 6/2011 | Daily et al. | |
| 2011/0198979 | A1 | 8/2011 | Shum et al. | |
| 2011/0315956 | A1* | 12/2011 | Tischler | H01L 23/4985 |
| | | | | 257/13 |
| 2012/0243261 | A1 | 9/2012 | Yamamoto et al. | |

FOREIGN PATENT DOCUMENTS

| | | |
|---|---|---|
| DE | 10 2004 036 157 A1 | 2/2006 |
| DE | 10 2006 020 529 A1 | 3/2007 |
| DE | 11 2005 003 345 T5 | 11/2007 |
| DE | 10 2009 009 609 A1 | 9/2010 |
| DE | 10 2010 043 220 A1 | 5/2012 |
| EP | 1 128 714 A1 | 8/2001 |
| JP | 08-124635 | 5/1996 |
| JP | 11-186713 | 7/1999 |
| JP | 2001-298200 | 10/2001 |
| JP | 2011-124577 | 6/2011 |
| JP | 2012-169274 | 8/2011 |
| JP | 2011-210962 | 10/2011 |

OTHER PUBLICATIONS

Notice of Reasons for Rejection dated Jul. 25, 2017, of corresponding Japanese Application No. 2016-520327 in English.
Chinese Office Action dated Jun. 16, 2017, of corresponding Chinese Application No. 201480034885.5, along with a Search Report in English.
English translation of the Notification for the Opinion of Examination dated Dec. 11, 2015 of corresponding Taiwanese Application No. 103120787.

* cited by examiner

OPTOELECTRONIC ARRANGEMENT

TECHNICAL FIELD

This disclosure relates to an optoelectronic arrangement.

BACKGROUND

Optoelectronic arrangements that comprise an optoelectronic semiconductor chip arranged on a circuit board are known. The optoelectronic semiconductor chip may, for example, be a light-emitting diode chip (LED chip). To electrically contact such optoelectronic arrangements, electrical conductors may be soldered directly onto solder contacts arranged on the circuit board. As an alternative, the circuit board may be provided with an electrical connector, for example, a jack connector in SMD design.

The electrical connector may be arranged on the circuit board at a time before or after the optoelectronic semiconductor chip. If the electrical connector is arranged on the circuit board before the optoelectronic semiconductor chip, then the connector may cause interference during subsequent process steps. If the electrical connector is arranged on the circuit board after the optoelectronic semiconductor chip, such action must be done on the component already separated at the time, which entails high outlay.

It is known to provide optoelectronic arrangements for different applications with different electrical connectors. Optoelectronic arrangements provided with different connectors may in other regards be configured in the same way. The need to equip otherwise equivalent optoelectronic arrangements with different electrical connectors increases the costs necessary for production of the optoelectronic arrangements.

It could therefore be helpful to provide an improved optoelectronic arrangement.

SUMMARY

We provide an optoelectronic arrangement including a first circuit board, a second circuit board, and an optoelectronic semiconductor chip arranged on the first circuit board, wherein a first electrical contact surface and a second electrical contact surface are formed on a surface of the first circuit board, a first mating contact surface and a second mating contact surface are formed on a surface of the second circuit board, and the first circuit board and the second circuit board connect to one another such that the surface of the first circuit board faces toward the surface of the second circuit board, and the first mating contact surface electrically conductively connect to the first contact surface and the second mating contact surface electrically conductively connects to the second contact surface.

We also provide an optoelectronic arrangement including a first circuit board, a second circuit board, and an optoelectronic semiconductor chip arranged on the first circuit board, wherein a first electrical contact surface and a second electrical contact surface are formed on a surface of the first circuit board, the first electrical contact surface and the second electrical contact surface electrically conductively connect to the optoelectronic semiconductor chip, a first mating contact surface and a second mating contact surface are formed on a surface of the second circuit board, the second circuit board includes an electrical connector, an electrical connection element of the electrical connector electrically conductively connects to the first mating contact surface, and the first circuit board and the second circuit board connect to one another such that the surface of the first circuit board faces toward the surface of the second circuit board, and the first mating contact surface electrically conductively connects to the first contact surface and the second mating contact surface electrically conductively connects to the second contact surface.

Figure 1:
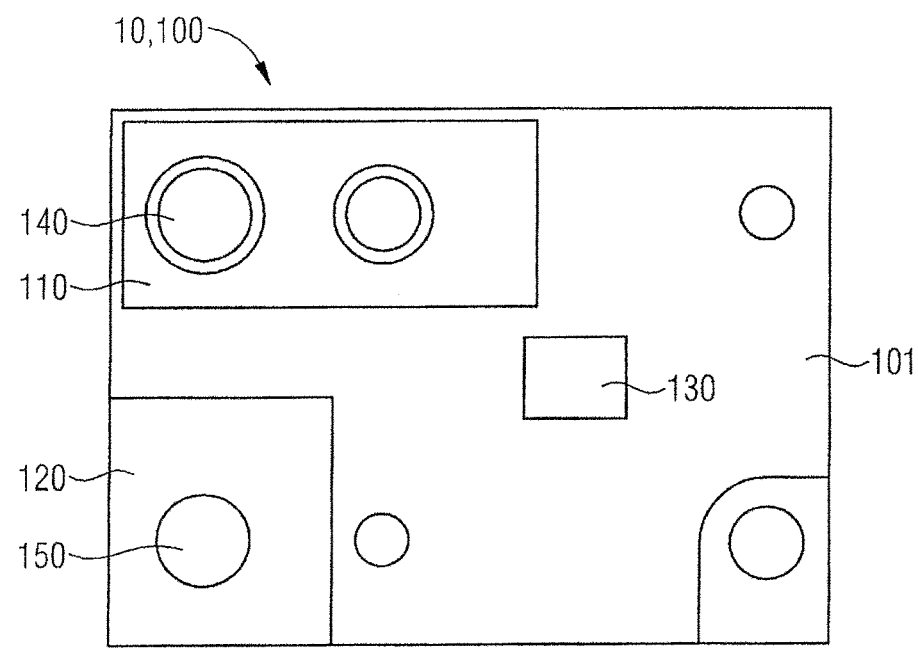
FIG. 1 shows a plan view of a first component circuit board of a first optoelectronic arrangement.

LIST OF REFERENCES 10 first optoelectronic arrangement
20 second optoelectronic arrangement
30 third optoelectronic arrangement
40 fourth optoelectronic arrangement
50 fifth optoelectronic arrangement
60 sixth optoelectronic arrangement
70 seventh optoelectronic arrangement
100 first component circuit board
101 surface
110 first electrical contact surface
120 second electrical contact surface
130 optoelectronic semiconductor chip
140 first bore
150 second bore
200 first connection circuit board
201 surface
210 first mating contact surface
220 second mating contact surface
230 electrical connector
231 first electrical connection element
232 second electrical connection element
233 connection side
240 first bore
250 second bore
300 first fastening means 310 first screw
320 second screw
1200 second connection circuit board
1210 first solder contact surface
1215 first conductor
1220 second solder contact surface
1225 second conductor
2100 second component circuit board
2130 third electrical contact surface
2140 fourth electrical contact surface
2150 slot
2160 further element
2200 third connection circuit board
2230 third mating contact surface
2233 third electrical connection element
2234 fourth electrical connection element
2240 fourth mating contact surface
2250 slot
3200 fourth connection circuit board
3210 further element
3233 third electrical connection element
4300 second fastening means
4310 first resilient element
4320 second resilient element
5300 third fastening means
5310 electrically conductive element
6300 fourth fastening means
6310 first clamp jaw
6320 second clamp jaw

DETAILED DESCRIPTION

Our optoelectronic arrangement comprises a first circuit board and a second circuit board. In this case, an optoelectronic semiconductor chip is arranged on the first circuit board. A first electrical contact surface and a second electrical contact surface are formed on a surface of the first circuit board. A first mating contact surface and a second mating contact surface are formed on a surface of the second circuit board. The first circuit board and the second circuit board connect to one another such that the surface of the first circuit board faces toward the surface of the second circuit board, the first mating contact surface electrically conductively connects to the first contact surface and the second mating contact surface electrically conductively connects to the second contact surface. The optoelectronic semiconductor chip arranged on the first circuit board of the optoelectronic arrangement may, for example, be a light-emitting diode chip (LED chip). The second circuit board of this optoelectronic arrangement may advantageously be used to electrically contact the first circuit board with the optoelectronic semiconductor chip arranged thereon. To this end, the first circuit board and the second circuit board of the optoelectronic arrangement may be connected to one another such that there are electrically conductive contacts between the contact surfaces of the first circuit board and the mating contact surfaces of the second circuit board. Advantageously, the first circuit board of the optoelectronic arrangement may form a core component which may be combined with differently configured second circuit boards. This makes it possible to provide the first circuit board with different electrical interfaces. In this way, the optoelectronic arrangement can advantageously be used for different applications. A further advantage is that the first circuit board of the optoelectronic arrangement does not need to be provided with an electrical connector so that the latter cannot interfere with the production of the first circuit board. This advantageously simplifies the production of the first circuit board.

The second circuit board may comprise an electrical connector. In this case, an electrical connection element of the electrical connector electrically conductively connects to the first mating contact surface. Advantageously, the electrical connector of the second circuit board may be used to electrically contact the optoelectronic arrangement. When the first circuit board and the second circuit board of the optoelectronic arrangement connect to one another, then there is an electrically conductive connection between the electrical connection element of the electrical connector and the optoelectronic semiconductor chip via the first mating contact surface of the second circuit board and the first contact surface of the first circuit board.

The electrical connector may be configured as a jack connector, as an insulation piercing connection device, as a screw contact or as a solder pin. Advantageously, the electrical connector of the second circuit board of the optoelectronic arrangement may in this way be configured for a specific application.

The second circuit board may comprise a first solder contact surface electrically conductively connected to the first mating contact surface. In this case, the second circuit board furthermore comprises a second solder contact surface electrically conductively connected to the second mating contact surface. The first solder contact surface and the second solder contact surface of the second circuit board may be used to electrically contact the optoelectronic arrangement. For example, electrical conductors may be soldered onto the first solder contact surface and the second solder contact surface of the second circuit board of the optoelectronic arrangement. In this way, an electrical connector is not required to electrically contact the optoelectronic arrangement. This offers the advantage that the optoelectronic arrangement can be configured particularly compactly and economically.

The first circuit board and the second circuit board may connect to one another by a resiliently flexible fastener. Advantageously, by virtue of the resiliently flexible fastener, reliable electrical connection can be ensured between the first mating contact surface of the second circuit board and the first contact surface of the first circuit board, as well as between the second mating contact surface of the second circuit board and the second contact surface of the first circuit board. The resiliently flexible fastener may in this case advantageously compensate for thermal expansions of the first circuit board and the second circuit board of the optoelectronic arrangement. In this way, reliable electrical connections are advantageously ensured between the mating contact surfaces of the second circuit board and the contact surfaces of the first circuit board over a multiplicity of heating and cooling cycles.

The first circuit board and the second circuit board may connect to one another by a screw connection. Advantageously, a screw connection offers a simple and economically producible possibility of reliably connecting the first circuit board and the second circuit board of the optoelectronic arrangement permanently to one another. The screw connection may in this case comprise one or more screws. The screws of the screw connection may have a thermal expansion coefficient adapted to the thermal expansion coefficients of the first circuit board and the second circuit board to ensure a reliable connection between the first circuit board and the second circuit board, in particular a reliable electrical connection between the mating contact surfaces of the second circuit board and the contact surfaces of the first circuit board, even in the event of heating or cooling the circuit boards of the optoelectronic arrangement.

The first circuit board and the second circuit board may connect to one another by a clamp connection. Advantageously, a clamp connection represents a simply mountable and economically producible possibility of connecting the first circuit board and the second circuit board of the optoelectronic arrangement to one another. The clamp connection may in this case advantageously be configured to be resiliently flexible.

The first electrical mating contact surface may be pressed against the first electrical contact surface, and the second electrical mating contact surface may be pressed against the second electrical contact surface when the second circuit board and the first circuit board connect to one another. Advantageously, there is therefore a direct electrically conductive connection between the first mating contact surface and the first contact surface as well as between the second mating contact surface and the second contact surface. Advantageously, the optoelectronic arrangement may therefore have a particularly low overall height.

The optoelectronic arrangement may comprise an electrically conductive element arranged between the first mating contact surface and the first contact surface and/or between the second mating contact surface and the second contact surface when the second circuit board and the first circuit board connect to one another. Advantageously, the electrically conductive element may compensate for length variations of the first circuit board and the second circuit board of the optoelectronic arrangement due to differently strong thermal expansions. In this way, even in the event of heating and cooling of the circuit boards of the optoelectronic arrangement, reliable electrical connections are ensured between the mating contact surfaces of the second circuit board and the contact surfaces of the first circuit board of the optoelectronic arrangement.

The first contact surface, the second contact surface, the first mating contact surface and/or the second mating contact surface may comprise a ductile material. Advantageously, the ductile material may compensate for possible height differences of the first contact surface, the second contact surface, the first mating contact surface and/or the second mating contact surface. In this way, advantageously, even when there are such possible height differences, reliable electrical contacts are ensured between the mating contact surfaces of the second circuit board and the contact surfaces of the first circuit board of the optoelectronic arrangement.

The first circuit board may comprise a slot arranged between the first contact surface and the second contact surface. As an alternative or in addition, the second circuit board comprises a slot arranged between the first mating contact surface and the second mating contact surface. Advantageously, the slot arranged in the first circuit board and/or the second circuit board may compensate for length variations of the first circuit board and the second circuit board due to thermal expansions of the first circuit board and the second circuit board so that reliable electrical connections between the mating contact surfaces of the second circuit board and the contact surfaces of the first circuit board of the optoelectronic arrangement are ensured even in the event of heating and cooling of the circuit boards of the optoelectronic arrangement.

The first circuit board may comprise a third electrical contact surface. In this case, the second circuit board comprises a third electrical mating contact surface. The first circuit board and the second circuit board connect to one another such that the third mating contact surface electrically conductively connects to the third contact surface. Advantageously, a third electrical connection of the optoelectronic arrangement can be provided by the third electrical contact surface and the third electrical mating contact surface.

The first circuit board may be configured as a metal core circuit board. Advantageously, the first circuit board of the optoelectronic arrangement therefore has a high thermal conductivity. This makes it possible for the first circuit board of the optoelectronic arrangement to effectively dissipate waste heat produced by the optoelectronic semiconductor chip. In this way, overheating of the optoelectronic semiconductor chip is prevented.

The second circuit board may be configured as an FR4 circuit board. Advantageously, the second circuit board may therefore be produced simply and economically.

A further element may be arranged on the first circuit board. The further element is in this case configured as a thermocouple, an NTC thermistor, an element to measure brightness, an encoding element, or a further optoelectronic semiconductor chip. A further optoelectronic semiconductor chip may advantageously be used to increase the optical output power of the optoelectronic arrangement. An encoding element may advantageously be used to encode a color locus, a brightness, a spectral distribution or a temperature excursion of the optoelectronic semiconductor chip of the optoelectronic arrangement. An element that measures brightness may be used to measure the brightness of electromagnetic radiation emitted by the optoelectronic semiconductor chip. An NTC thermistor may be used to determine the temperature at the position of the first circuit board of the optoelectronic arrangement. A thermocouple may also be used to determine a temperature.

The third electrical contact surface may electrically conductively connect to the further element. Advantageously, the first element of the first circuit board of the optoelectronic arrangement may then electrically contact via the third electrical contact surface and the third electrical mating contact surface.

The first electrical contact surface and the second electrical contact surface may electrically conductively connect to the optoelectronic semiconductor chip. The optoelectronic semiconductor chip of the optoelectronic arrangement may in this way advantageously electrically contact from the outside via the first electrical contact surface and the second electrical contact surface, as well as the first electrical mating contact surface and the second electrical mating contact surface.

A further element configured as drive electronics to drive the optoelectronic semiconductor chip, a protective circuit to protect the optoelectronic semiconductor chip, a monitoring circuit to electrically or thermally monitor the optoelectronic semiconductor chip, a monitor circuit to record a history of the optoelectronic semiconductor chip, and/or an encoding element, may be arranged on the second circuit board. The encoding element may, for example, encode a color locus, a brightness, a spectral distribution or a temperature excursion of the optoelectronic semiconductor chip of the optoelectronic arrangement.

The above-described properties, features and advantages, as well as the way in which they are achieved, will become more clearly and comprehensively understandable in connection with the following description of examples which will be explained in more detail in connection with the drawings.

FIGS. 1 to 4 show components of a first optoelectronic arrangement 10. The first optoelectronic arrangement 10 may, for example, be a light-emitting diode arrangement.

FIG. 1 shows a schematic plan view of a first component circuit board 100 of the first optoelectronic arrangement 10. The first component circuit board 100 may also be referred to as a printed circuit board or PCB. The first component circuit board 100 may, for example, be configured as a metal core circuit board with a metallization arranged inside it. In this case, the first component circuit board 100 advantageously has a high thermal conductivity.

A first electrical contact surface 110 and a second electrical contact surface 120 are formed on a surface 101 of the first component circuit board 100. The first electrical contact surface 110 and the second electrical contact surface 120 are respectively configured as flat metallizations. The first electrical contact surface 110 may, for example, be formed by a metallization arranged on the surface 101 of the first component circuit board 100. The first electrical contact surface 110 is then electrically insulated from an optional metal core of the first component circuit board 100. The second electrical contact surface 120 may likewise be formed by a metallization arranged on the surface 101 of the first component circuit board 100. In this case, the second electrical contact surface 120 is likewise electrically insulated from an optional metal core of the first component circuit board 100. The second electrical contact surface 120 may, however, also be formed by an exposed section of a metal core of the first component circuit board 100, when the latter is configured as a metal core circuit board. In this case, the second electrical contact surface 120 of the first component circuit board 100 electrically conductively connects to the metal core of the first component circuit board 100.

In the example of the first component circuit board 100 as represented in FIG. 1, the first electrical contact surface 110 and the second electrical contact surface 120 are both arranged close to the same outer edge of the first component circuit board 100. The first electrical contact surface 110 is arranged in a first corner region of the rectangularly configured first component circuit board 100. The second electrical contact surface 120 is arranged in a second corner region of the first component circuit board 100.

An optoelectronic semiconductor chip 130 is arranged on the surface 101 of the first component circuit board 100. The optoelectronic semiconductor chip 130 is configured to emit electromagnetic radiation, for example, visible light. The optoelectronic semiconductor chip 130 may, for example, be a light-emitting diode chip (LED chip). The optoelectronic semiconductor chip 130 may, however, also be a laser chip or another optoelectronic semiconductor chip.

The optoelectronic semiconductor chip 130 electrically conductively connects to the first electrical contact surface 110 and to the second electrical contact surface 120. This makes it possible to apply an electrical voltage to the optoelectronic semiconductor chip 130 between the first electrical contact surface 110 and the second electrical contact surface 120 to operate the optoelectronic semiconductor chip 130. The electrically conductive connection between the optoelectronic semiconductor chip 130 and the first electrical contact surface 110 may, for example, comprise a bonding wire. The electrically conductive connection between the optoelectronic semiconductor chip 130 and the second electrical contact surface 120 may, for example, be formed by an electrically conductive connection existing on a lower side of the optoelectronic semiconductor chip 130, between the optoelectronic semiconductor chip 130 and a metal core of the first component circuit board 100, if the first component circuit board 100 is configured as a metal core circuit board. The optoelectronic semiconductor chip 130 may, however, also connect to the second electrical contact surface 120 by a bonding wire or another electrically conductive connection.

The first component circuit board 100 has a first bore 140 and a second bore 150. The first bore 140 and the second bore 150 form access openings oriented perpendicularly with respect to the surface 101 of the first component circuit board 100 and extend through the first component circuit board 100. In the example of the first component circuit board 100 as shown in FIG. 1, the first bore 140 is arranged in the first corner region of the first component circuit board 100 and passes through the first electrical contact surface 110. The second bore 150 is arranged in the second corner region of the first component circuit board 100 and passes through the second electrical contact surface 120. It would, however, also be possible to arrange the first bore 140 and the second bore 150 at other positions of the first component circuit board 100. The first component circuit board 100 could also have only the first bore 140 or more than two bores 140, 150.

Figure 2:
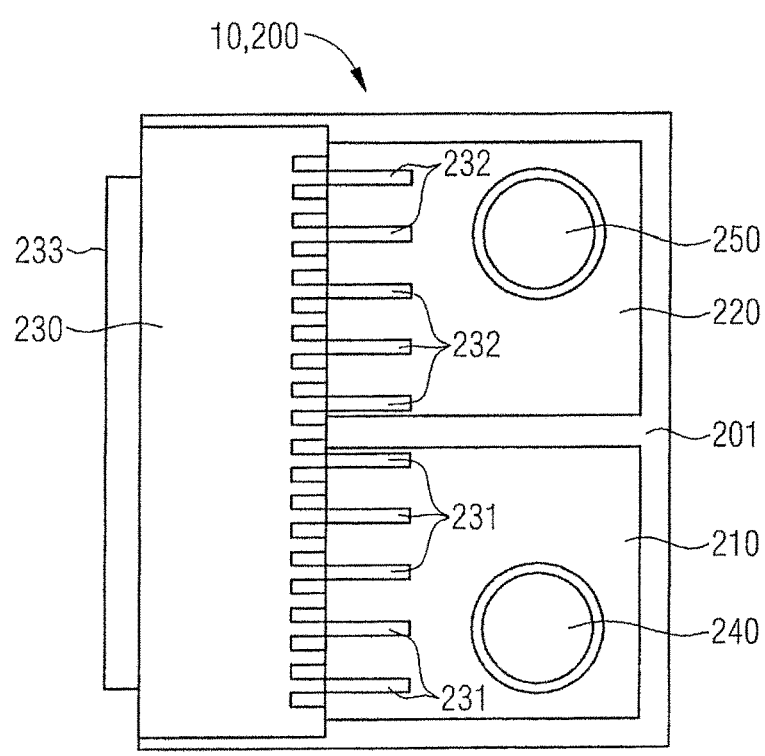
FIG. 2 shows a plan view of a first connection circuit board of the first optoelectronic arrangement.

FIG. 2 shows a schematic plan view of a first connection circuit board 200 of the first optoelectronic arrangement 10. The first connection circuit board 200 may also be referred to as a printed circuit board or PCB. The first connection circuit board 200 may have a conventional and economical circuit board substrate, for example, an FR4 substrate.

A first mating contact surface 210 and a second mating contact surface 220 are formed on a surface 201 of the first connection circuit board 200. The first mating contact surface 210 and the second mating contact surface 220 are respectively formed by flat metallizations. In the example of the first connection circuit board 200 as shown in FIG. 2, the first mating contact surface 210 and the second mating contact surface 220 are arranged close to a common outer edge of the first connection circuit board 200. The first mating contact surface 210 is arranged in a first corner region of the first connection circuit board 200. The second mating contact surface 220 is arranged in a second corner region of the first connection circuit board 200.

An electrical connector 230 is arranged on the surface 201 of the first connection circuit board 200. The electrical connector 230 provides electrically conductive connections to the first mating contact surface 210 and the second mating contact surface 220 of the first connection circuit board 200. To this end, first electrical connection elements 231 of the electrical connector 230 electrically conductively connect to the first mating contact surface 210. Second electrical connection elements 232 of the electrical connector 230 electrically conductively connect to the second mating contact surface 220 of the first connection circuit board 200. The first electrical connection elements 231 and the second electrical connection elements 232 of the electrical connector 230 may, for example, connect by solder connections to the mating contact surfaces 210, 220 of the first connection circuit board 200.

On a connection side 233 of the electrical connector 230, the electrical connector 230 provides electrically conductive connections to the first electrical connection elements 231 and the second electrical connection elements 232 and, therefore, also to the first mating contact surface 210 and the second mating contact surface 220. In the example of the first connection circuit board 200 as shown in FIG. 2, the electrical connector 230 is configured as a jack connector. The connection side 233 of the electrical connector 230 is formed by an insertion side of the electrical connector 230 configured as a jack connector, which side is intended to be plugged together to a matching jack connector mating piece to produce electrically conductive connections between the electrical connection elements 231, 232 of the electrical connector 230 and corresponding connection elements of the jack connector mating piece.

In the example of the first connection circuit board 200 as shown in FIG. 2, only one electrical connector 230 is provided, which provides electrically conductive connections both to the first mating contact surface 210 and the second mating contact surface 220. It would, however, also be possible to provide to separate electrical connectors for contacting the first mating contact surface 210 and the second mating contact surface 220. Other than as jack connectors, the electrical connector 230, or the plurality of electrical connectors may, for example, also be configured as insulation piercing connection devices, as screw contacts (terminal blocks) or as solder pins.

The first connection circuit board 200 has a first bore 240 and a second bore 250. The first bore 240 and the second bore 250 respectively extend as openings oriented perpendicularly to the surface 201 of the first connection circuit board 200, through the first connection circuit board 200. The first bore 240 is arranged in the first corner region of the first connection circuit board 200 and passes through the first mating contact surface 210. The second bore 250 is arranged in the second corner region of the first connection circuit board 200 and passes through the second mating contact surface 220. The diameters of the first bore 240 and of the second bore 250 of the first connection circuit board 200 preferably correspond approximately to the diameters of the first bore 140 and the second bore 150 of the first component circuit board 100. The distance between the bores 240, 250 of the first connection circuit board 200 corresponds approximately to the distance between the first bore 140 and the second bore 150 of the first component circuit board 100.

Figure 3:
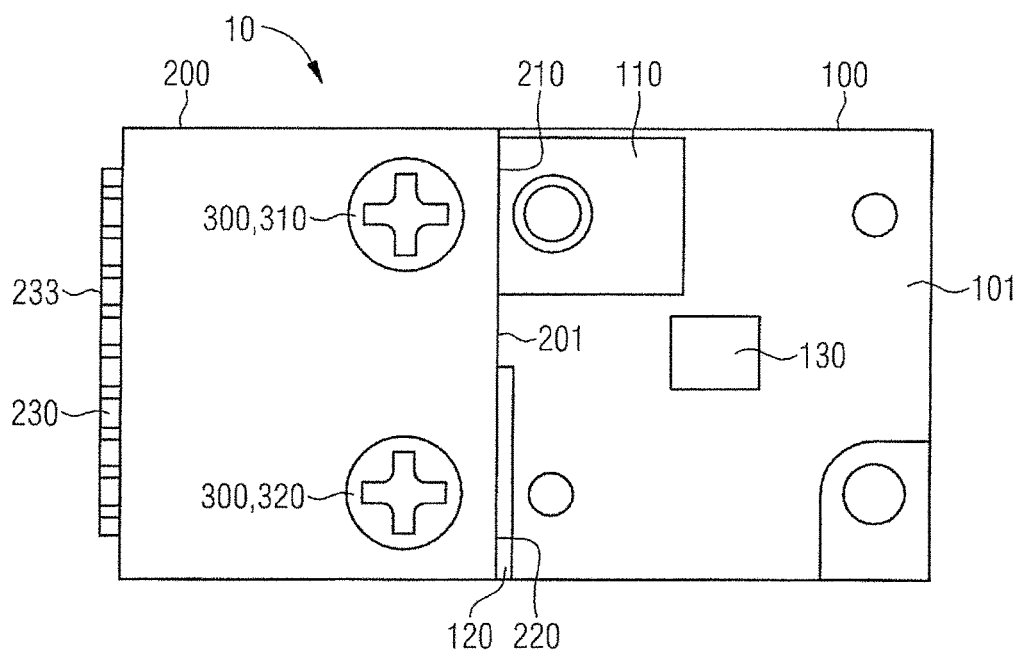
FIG. 3 shows a plan view of the first optoelectronic arrangement with the first component circuit board and the first connection circuit board.
Figure 4:
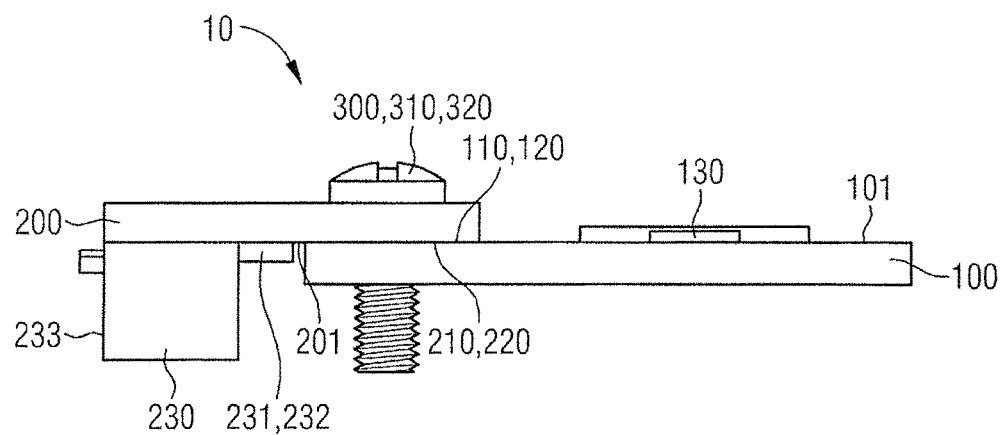
FIG. 4 shows a side view of the first optoelectronic arrangement with the first component circuit board and the first connection circuit board.

The first component circuit board 100 of the first optoelectronic arrangement 10 and the first connection circuit board 200 of the first optoelectronic arrangement 10 connect to one another such that the surface 101 of the first component circuit board 100 faces toward the surface 201 of the first connection circuit board 200, the first mating contact surface 210 of the first connection circuit board 200 electrically conductively connects to the first contact surface 110 of the first component circuit board 100, and the second mating contact surface 220 of the first connection circuit board 200 electrically conductively connects to the second electrical contact surface 120 of the first component circuit board 100. FIG. 3 shows a schematic plan view of the circuit boards 100, 200, connected to one another, of the first optoelectronic arrangement 10. FIG. 4 shows a schematic side view of the circuit boards 100, 200, connected to one another, of the first optoelectronic arrangement 10.

The first component circuit board 100 and the first connection circuit board 200 of the first optoelectronic arrangement 10 connect to one another by a first fastening means 300. The first fastening means 300 is configured as a screw connection and, in the example shown in FIGS. 3 and 4, comprises a first screw 310 and a second screw 320. A different number of screws would, however, likewise be possible. The first screw 310 extends through the first bore 140 of the first component circuit board 100 and the first bore 240 of the first connection circuit board 200. The second screw 320 extends through the second bore 150 of the first component circuit board 100 and the second bore 250 of the first connection circuit board 200. The first screw 310 and the second screw 320 of the first fastening means 300 may respectively be secured by a nut, although this is not represented in FIGS. 3 and 4.

In the connected state of the first connection circuit board 200 and the first component circuit board 100 shown in FIGS. 3 and 4, the first mating contact surface 210 of the first connection circuit board 200 electrically conductively connects to the first electrical contact surface 110. In this way, there is an electrically conductive connection between the electrical connector 230 of the first connection circuit board 200 and the optoelectronic semiconductor chip 130 of the first component circuit board 100. The second mating contact surface 220 of the first connection circuit board 200 presses against the second electrical contact surface 120 such that there is an electrically conductive connection between the second mating contact surface 220 and the second electrical contact surface 120. In this way, there is also an electrically conductive connection between the electrical connector 230 of the first connection circuit board 200 and the optoelectronic semiconductor chip 130 of the first component circuit board 100.

The first electrical contact surface 110 of the first component circuit board 100, the second electrical contact surface 120 of the first component circuit board 100, the first mating contact surface 210 of the first connection circuit board 200 and/or the second mating contact surface 220 of the first connection circuit board 200 may comprise a ductile material that deforms when the mating contact surfaces 210, 220 and the electrical contact surfaces 110, 120 are pressed together to compensate for possible height differences. The ductile material may, for example, comprise a tin solder.

Figure 5:
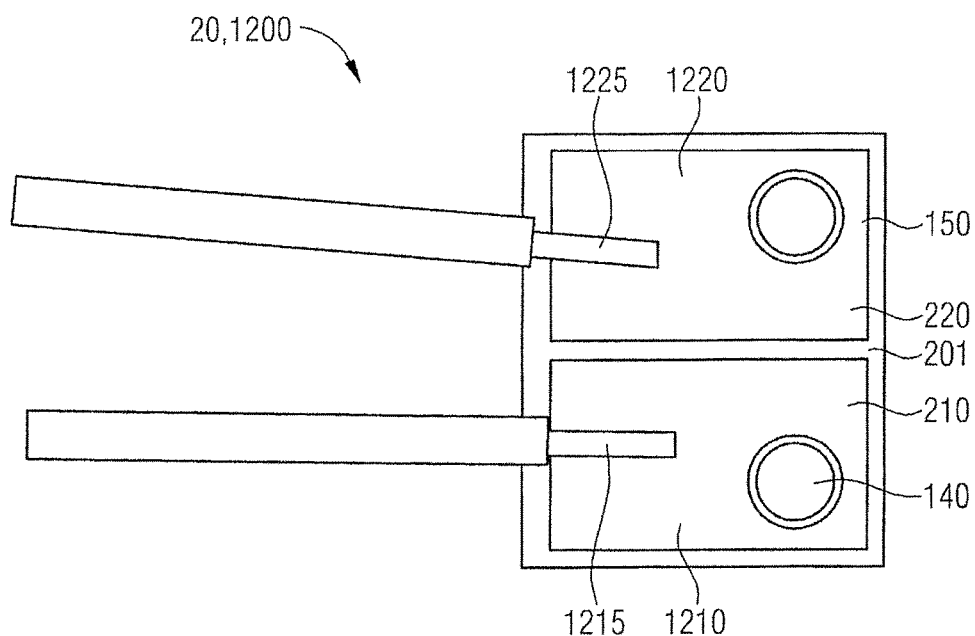
FIG. 5 shows a plan view of a second connection circuit board of a second optoelectronic arrangement.
Figure 6:
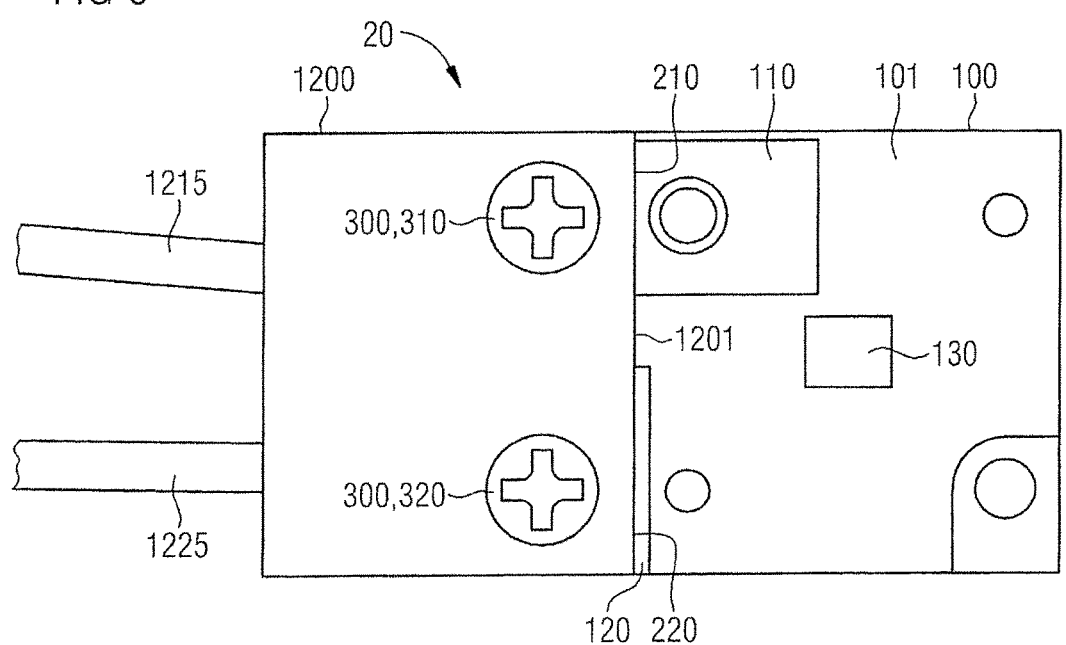
FIG. 6 shows a plan view of the second optoelectronic arrangement with the first component circuit board and the second connection circuit board.
Figure 7:
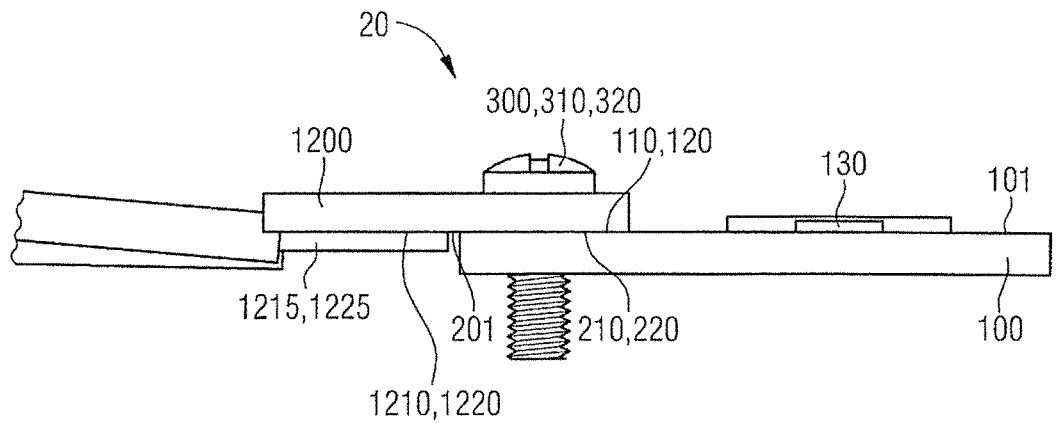
FIG. 7 shows a side view of the second optoelectronic arrangement with the first component circuit board and the second connection circuit board.

FIGS. 5 to 7 show components of a second optoelectronic arrangement 20. The second optoelectronic arrangement 20 has correspondences with the first optoelectronic arrangement 10 of FIGS. 1 to 4. Components of the second optoelectronic arrangement 20 corresponding to components present in the first optoelectronic arrangement 10 are provided with the same references in FIGS. 5 to 7 as in FIGS. 1 to 4, and will not be described again in detail below. Only the differences between the second optoelectronic arrangement 20 and the first optoelectronic arrangement 10 will be explained.

FIG. 5 shows a schematic plan view of a second connection circuit board 1200 of the second optoelectronic arrangement 20. The second connection circuit board 1200 replaces the first connection circuit board 200 of the first optoelectronic arrangement 10. Instead of the electrical connector 230, the second connection circuit board 1200 has a first solder contact surface 1210 and a second solder contact surface 1220. The first solder contact surface 1210 electrically conductively connects to the first mating contact surface 210. In the example represented, the first solder contact surface 1210 and the first mating contact surface 210 continuously flatly merge into one another. The second solder contact surface 1220 electrically conductively connects to the second mating contact surface 220. In the example represented, the second solder contact surface 1220 and the second mating contact surface 220 continuously flatly merge into one another.

The first solder contact surface 1210 and the second solder contact surface 1220 of the second connection circuit board 1200 are respectively intended for the soldering of electrical conductors. In FIG. 5, by way of example, a first conductor 1215 is soldered to the first solder contact surface 1210. In the exemplary representation, a second conductor 1225 is soldered to the second solder contact surface 1220.

Besides the second connection circuit board 1200, the second optoelectronic arrangement 20 comprises the first component circuit board 100 of FIG. 1.

FIG. 6 shows a schematic plan view of the second optoelectronic arrangement 20 in a state in which the first component circuit board 100 connects to the second connection circuit board 1200 by the first fastening means 300. FIG. 7 shows a schematic side view of the second optoelectronic arrangement 20 with the second connection circuit board 1200 connected to the first component circuit board 100. The surface 201 of the second connection circuit board 1200 of the second optoelectronic arrangement 20 faces toward the surface 101 of the first component circuit board 100 of the second optoelectronic arrangement 20. The first mating contact surface 210 of the second connection circuit board 1200 presses against the first electrical contact surface 110 of the first component circuit board 100 so that there is an electrically conductive connection between the first mating contact surface 210 and the first electrical contact surface 110. The second mating contact surface 220 of the second connection circuit board 1200 presses against the second electrical contact surface 120 of the first component circuit board 100 so that there is an electrically conductive connection between the second mating contact surface 220 and the second electrical contact surface 120. In this way, in the second optoelectronic arrangement 20, the optoelectronic semiconductor chip 130 arranged on the first component circuit board 100 can be contacted via the first conductor 1215 connected to the second connection circuit board 1200 and the second conductor 1225 connected to the second connection circuit board 1200.

Figure 8:
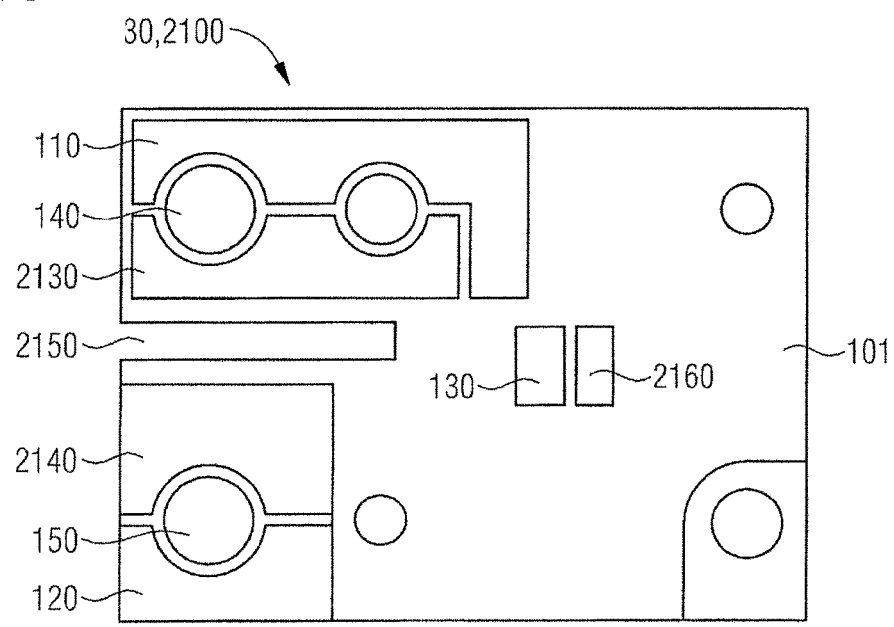
FIG. 8 shows a plan view of a second component circuit board of a third optoelectronic arrangement.
Figure 9:
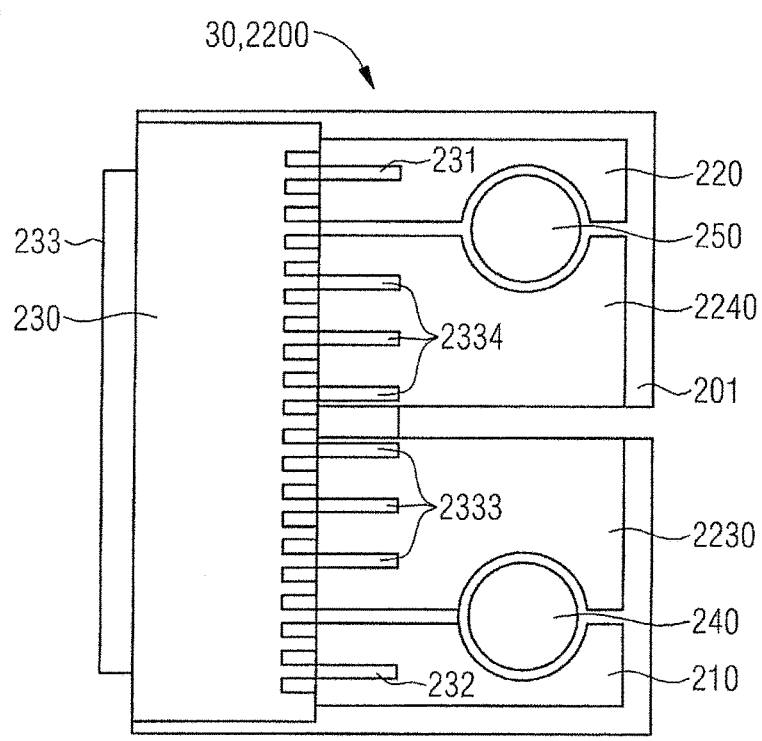
FIG. 9 shows a plan view of a third connection circuit board of the third optoelectronic arrangement.

FIGS. 8 and 9 show schematic representations of components of a third optoelectronic arrangement 30. The third optoelectronic arrangement 30 has correspondences with the first optoelectronic arrangement 10 of FIGS. 1 to 4. Components of the third optoelectronic arrangement 30 corresponding to components present in the first optoelectronic arrangement 10 are provided with the same references in FIGS. 8 and 9 as in FIGS. 1 to 4 and will not be explained again in detail below. Only the differences between the third optoelectronic arrangement 30 and the first optoelectronic arrangement 10 will be explained.

FIG. 8 shows a plan view of a second component circuit board 2100 of the third optoelectronic arrangement 30. The second component circuit board 2100 replaces the first component circuit board 100. In addition to the first electrical contact surface 110 and the second electrical contact surface 120, the second component circuit board 2100 has a third electrical contact surface 2130 and a fourth electrical contact surface 2140. The third electrical contact surface 2130 and the fourth electrical contact surface 2140 are, like the first electrical contact surface 110 and the second electrical contact surface 120, formed on the surface 101 of the second component circuit board 2100. The first electrical contact surface 110, the second electrical contact surface 120, the third electrical contact surface 2130 and the fourth electrical contact surface 2140 of the second component circuit board 2100 are respectively electrically insulated from one another.

In addition to the optoelectronic semiconductor chip 130, the second component circuit board 2100 also has a further element 2160 arranged on the surface 101 of the second component circuit board 2100. The further element 2160 electrically conductively connects to the third electrical contact surface 2130 and the fourth electrical contact surface 2140 so that the further element 2160 can receive current and voltage via the third electrical contact surface 2130 and the fourth electrical contact surface 2140. It is also possible to connect the optoelectronic semiconductor chip 130 and the further element 2160 of the second component circuit board 2100 to the electrical contact surfaces 110, 120, 2130, 2140 of the second component circuit board 2100 such that the optoelectronic semiconductor chip 130 and the further element 2160 of the second component circuit board 2100 share a common ground contact. In this case, one of the electrical contact surfaces 110, 120, 2130, 2140 of the second component circuit board 2100 may be omitted or used for another purpose.

The further element 2160 of the second component circuit board 2100 may, for example, be a further optoelectronic semiconductor chip. The further element 2160 may also be a thermocouple or an NTC thermistor. In this case, the further element 2160 may be used to monitor a temperature at the position of the second component circuit board 2100, for example, a temperature of the optoelectronic semiconductor chip 130. The further element 2160 of the second component circuit board 2100 may also be an element that measures brightness. In this case, the further element 2160 may be used to measure the brightness of electromagnetic radiation emitted by the optoelectronic semiconductor chip 130 of the second component circuit board 2100. The further element 2160 of the second component circuit board 2100 may also be an encoding element used, for example, to encode a color locus, brightness, spectral distribution or temperature excursion of the optoelectronic semiconductor chip 130 of the second component circuit board 2100. The further element 2160 forming the encoding element may in this case, for example, be configured as a resistor network. The further element 2160 of the second component circuit board 2100 of the third optoelectronic arrangement 30 may also be another active or passive component.

The second component circuit board 2100 has a slot 2150 extending from an outer edge of the second component circuit board 2100 into the second component circuit board 2100. The slot 2150 is arranged on the outer edge of the second component circuit board 2100 next to which the electrical contact surfaces 110, 120, 2130, 2140 of the second component circuit board 2100 are located. In the example represented in FIG. 8, the first electrical contact surface 110 and the third electrical contact surface 2130 of the second component circuit board 2100 are arranged on one side of the slot 2150. In the example shown in FIG. 8, the second electrical contact surface 120 and the fourth electrical contact surface 2140 are arranged on the other side of the slot 2150. The slot 2150 of the second component circuit board 2100 allows a certain deformation of the second component circuit board 2100. In particular, the slot 2150 allows variation of the distance between the first electrical contact surface 110 and the second electrical contact surface 120 of the second component circuit board 2100, variation of the distance between the third electrical contact surface 2130 and the fourth electrical contact surface 2140 of the second component circuit board 2100, and variation of the distance between the first bore 140 and the second bore 150 of the second component circuit board 2100. The slot 2150 of the second component circuit board 2100 therefore allows compensation for thermal length variations.

FIG. 9 shows a plan view of a third connection circuit board 2200 of the third optoelectronic arrangement 30. The third connection circuit board 2200 replaces the first connection circuit board 200. In addition to the first mating contact surface 210 and the second mating contact surface 220, the third connection circuit board 2200 has a third mating contact surface 2230 and a fourth mating contact surface 2240. The individual mating contact surfaces 210, 220, 2230, 2240 of the third connection circuit board 2200 are respectively electrically insulated from one another. Third electrical connection elements 2230 of the electrical connector 230 of the third connection circuit board 2200 electrically conductively connect to the third mating contact surface 2230, for example, by solder connections. Fourth electrical connection elements 2234 of the electrical connector 230 of the third connection circuit board 2200 electrically conductively connect to the fourth mating contact surface 2240, for example, soldered to the fourth mating contact surface 2240. The electrical connector 230 of the third connection circuit board 2200 therefore provides electrically conductive connections to the first mating contact surface 210, to the second mating contact surface 220, the third mating contact surface 2230 and the fourth mating contact surface 2240 of the third connection circuit board 2200.

The third connection circuit board 2200 has a slot 2250 extending from an outer edge of the third connection circuit board 2200 into the third connection circuit board 2200. The slot 2250 is arranged on that outer edge of the third connection circuit board 2200 next to which the mating contact surfaces 210, 220, 2230, 2240 of the third connection circuit board 2200 are arranged. The slot 2250 extends between the first mating contact surface 210 and the second mating contact surface 220, as well as between the third mating contact surface 2230 and the fourth mating contact surface 2240. The slot 2250 allows a certain deformation of the third connection circuit board 2200. In this way, variation of the distance between the first mating contact surface 210 and the third mating contact surface 2230 on one side, and the second mating contact surface 220 and the fourth mating contact surface 2240 of the third connection circuit board 2200 on the other side is made possible. Furthermore, the slot 2250 allows variation of the distance between the first bore 240 and the second bore 250 of the third connection circuit board 2200. This allows compensation for a thermal length variation.

When the second component circuit board 2100 and the third connection circuit board 2200 of the third optoelectronic arrangement 30 connect to one another, the surface 110 of the second component circuit board 2100 faces toward the surface 201 of the third connection circuit board 2200. The first mating contact surface 210 of the third connection circuit board 2200 presses against the first electrical contact surface 110 of the second component circuit board 2100 so that there is an electrically conductive connection between the first mating contact surface 210 and the first electrical contact surface 110. Correspondingly, the second mating contact surface 220 presses against the second electrical contact surface 120, the third mating contact surface 2230 is pressed against the third electrical contact surface 2130, and the fourth mating contact surface 2240 presses against the fourth electrical contact surface 2140 so that there are electrically conductive connections between the second mating contact surface 220 and the second electrical contact surface 120, between the third mating contact surface 2230 and the third electrical contact surface 2130, and between the fourth mating contact surface 2240 and the fourth electrical contact surface 2140. Again, the electrical contact surfaces 110, 120, 2130, 2140 and/or the mating contact surfaces 210, 220, 2230, 2240 may comprise a ductile material which by deformation allows compensation for certain height differences.

If one of the electrical contact surfaces 110, 120, 2130, 2140 of the second component circuit board 2100 of the third optoelectronic arrangement 30 is omitted, then the corresponding mating contact surface 210, 220, 2230, 2240 of the third connection circuit board 2200 of the third optoelectronic arrangement 30 may also be omitted. It is also possible to configure the second component circuit board 2100 with more than 40,001 four electrical contact surfaces 110, 120, 2130, 2140. In this case, the third connection circuit board 2200 should also have a correspondingly larger number of mating contact surfaces 210, 220, 2230, 2240.

The second component circuit board 2100 and the third connection circuit board 2200 of the third optoelectronic arrangement 300 may have different thermal expansion coefficients to one another. In this case, the second component circuit board 2100 and the third connection circuit board 2200 expand to different extents in the lateral direction in the event of heating. The differently strong thermal expansions of the second component circuit board 2100 and the third connection circuit board 2200 may be compensated for by the slot 2150 arranged in the second component circuit board 2100 and/or the slot 2250 arranged in the third connection circuit board 2200. In this way, a reliable electrical connection is ensured between the electrical contact surfaces 110, 120, 2130, 2140 of the second component circuit board 2100 and the mating contact surfaces 210, 220, 2230, 2240 of the third connection circuit board 2200, and damage to the second component circuit board 2100 and the third connection circuit board 2200 is prevented, even in the event of differently strong thermal expansions of the second component circuit board 2100 and the third connection circuit board 2200. One of the slots 2150, 2250 may also be omitted. Instead of the slots 2150, 2250, the second component circuit board 2100 and the third connection circuit board 2200 of the third optoelectronic arrangement 30 could also have elongate holes that are not open toward the outer edges of the second component circuit board 2100 and the third connection circuit board 2200. Such elongate holes also allow a certain deformation of the circuit boards 2100, 2200.

During heating, the second component circuit board 2100 and the third connection circuit board 2200 of the third optoelectronic arrangement 30 also extend in the direction perpendicular to the planes of the second component circuit board 2100 and the third connection circuit board 2200. The first screw 310 and the second screw 320 of the first fastening means 300 of the third optoelectronic arrangement 30 may be made of a material having a thermal expansion coefficient adapted to the thermal expansion coefficients of the second component circuit board 2100 and the third connection circuit board 2200, for example, lying between the thermal expansion coefficient of the second component circuit board 2100 and the thermal expansion coefficient of the third connection circuit board 2200. In the event of heating, the screws 310, 320 of the first fastening means 300 therefore also experience a length variation by which the thermal expansion of the circuit boards 2100, 2200 of the third optoelectronic arrangement 30 is compensated for or taken into account.

Figure 10:
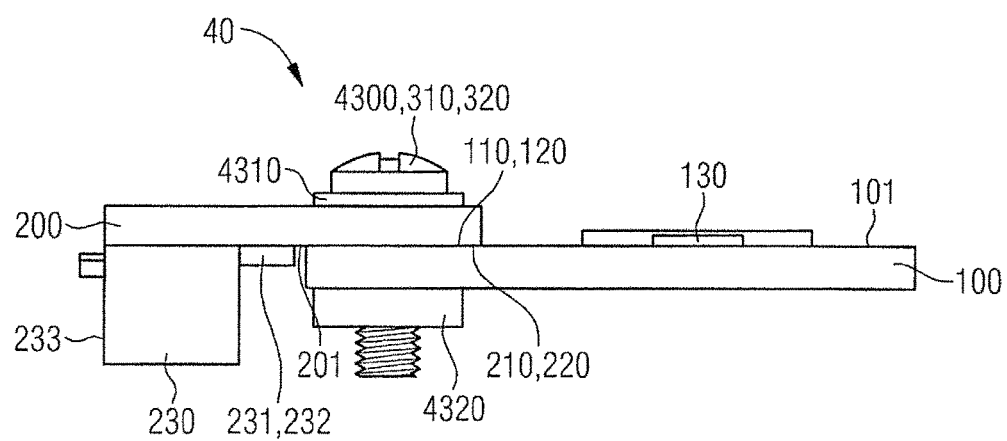
FIG. 10 shows a side view of a fourth optoelectronic arrangement with a second fastener.

FIG. 10 shows a schematic side view of a fourth optoelectronic arrangement 40. The fourth optoelectronic arrangement 40 has correspondences with the first optoelectronic arrangement 10 of FIGS. 1 to 4. Components of the fourth optoelectronic arrangement corresponding to components present in the first optoelectronic arrangement 10 are provided with the same references in FIG. 10 as in FIGS. 1 to 4 and will not be described again in detail below. Only the differences between the fourth optoelectronic arrangement 40 and the first optoelectronic arrangement 10 will be explained below.

The fourth optoelectronic arrangement 40 has a second fastening means 4300 that replaces the first fastening means 300. The second fastening means 4300 is used to fasten the first component circuit board 100 and the first connection circuit board 200 of the fourth optoelectronic arrangement 40 to one another. Like the first fastening means 300, the second fastening means 4300 has a first screw 310 and a second screw 320. Furthermore, for each screw 310, 320, the second fastening means 4300 respectively has a first resilient element 4310 and a second resilient element 4320. The resilient elements 4310, 4320 comprise an electrically flexible material. The resilient elements 4310, 4320 preferably furthermore comprise an electrically insulating material. The resilient elements 4310, 4320 are respectively configured in the shape of a ring. The first screw 310 and the second screw 320 respectively extend through the first resilient element 4310 assigned to them and the second resilient element 4320 assigned to them. The first component circuit board 100 and the first connection circuit board 200 of the fourth optoelectronic arrangement 40 are arranged between the two first resilient elements 4310 and the two second resilient elements 4320 of the second fastening means 4300. The elastically flexible resilient elements 4310, 4320 compensate for a thermal length variation of the first component circuit board 100 and of the first connection circuit board 200 of the fourth optoelectronic arrangement 40. In a simplified variant of the second fastening means 4300, either the first resilient element 4310 or the second resilient element 4320 may be omitted.

Of course, the second fastening means 4300 could also be used in the second optoelectronic arrangement 20 or the third optoelectronic arrangement 30.

Figure 11:
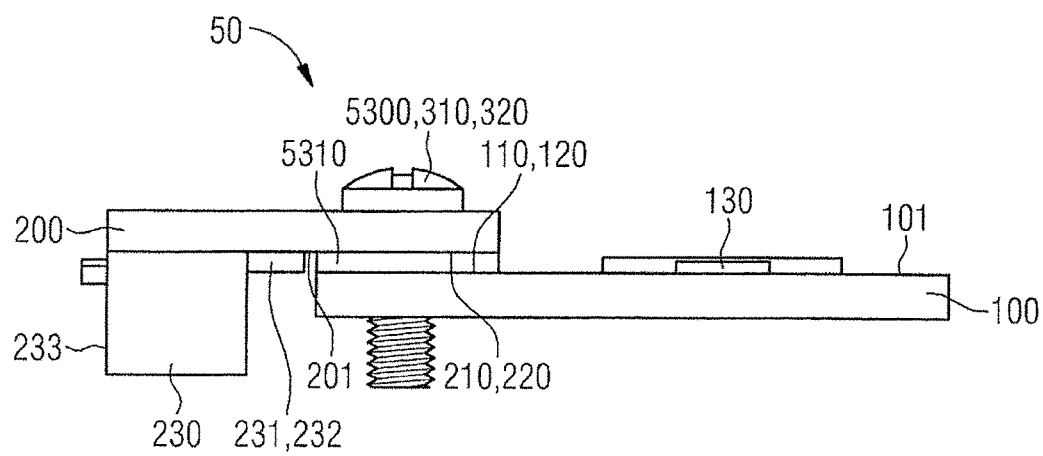
FIG. 11 shows a side view of a fifth optoelectronic arrangement with a third fastener.

FIG. 11 shows a schematic side view of a fifth optoelectronic arrangement 50. The fifth optoelectronic arrangement 50 has correspondences with the first optoelectronic arrangement 10 of FIGS. 1 to 4. Components of the fifth optoelectronic arrangement 50 corresponding to components present in the first optoelectronic arrangement 10 are provided with the same references in FIG. 11 as in FIGS. 1 to 4 and will not be described again in detail below. Only the differences between the fifth optoelectronic arrangement 50 and the first optoelectronic arrangement 10 will be explained below.

The fifth optoelectronic arrangement 50 has a third fastening means 5300 that replaces the first fastening means 300 of the first optoelectronic arrangement 10. Like the first fastening means 300, the third fastening means 5300 comprises a first screw 310 and a second screw 320, which are used to connect the first component circuit board 100 and the first connection circuit board 200 of the fifth optoelectronic arrangement 50 to one another. In addition, the third fastening means 5300 comprises an electrically conductive element 5310. The electrically conductive element 5310 is arranged between the surface 101 of the first component circuit board 100 and the surface 201 of the first connection circuit board 200, and compensates for thermal length variations, in particular thermal thickness variations, of the first component circuit board 100 and the first connection circuit board 200 of the fifth optoelectronic arrangement 50. To this end, the electrically conductive element 5310 is elastically flexible.

The electrically conductive element 5310 has openings through which the first screw 310 and the second screw 320 of the third fastening means 5300 extend.

The electrically conductive element 5310 has two sections electrically insulated from one another. The two sections of the electrically conductive element 5310 may also be physically separated from one another. The first section of the electrically conductive element 5310 is arranged between the first electrical contact surface 110 of the first component circuit board 100 and the first mating contact surface 210 of the first connection circuit board 200. The second section of the electrically conductive element 5310 is arranged between the second electrical contact surface 120 of the first component circuit board 100 and the second mating contact surface 220 of the first connection circuit board 200. The sections of the electrically conductive element 5310 in this case respectively produce electrically conductive connections between the electrical contact surfaces 110, 120 of the first component circuit board 100 and the associated mating contact surfaces 210, 220 of the first connection circuit board 200.

It is also possible to configure the electrically conductive element 5310 not with two sections separated from one another. In this case, the electrically conductive element 5310 is configured in one piece. The electrically conductive element 5310 then has an isotropic electrical conductivity that ensures that, despite the electrically conductive element 5310 being continuous in one piece, there are only electrically conductive connections respectively between the first electrical contact surface 110 and the first mating contact surface 210, and the second electrical contact surface 120 and the second mating contact surface 220. To this end, for example, the electrically conductive element 5310 may have vertical conductive elements (vias), consisting of metal or another conductive material such as carbon or graphite, embedded in a soft plastic material.

The third fastening means 5300 of the fifth optoelectronic arrangement 50 may also be used in the second optoelectronic arrangement 20 or the third optoelectronic arrangement 30.

Figure 12:
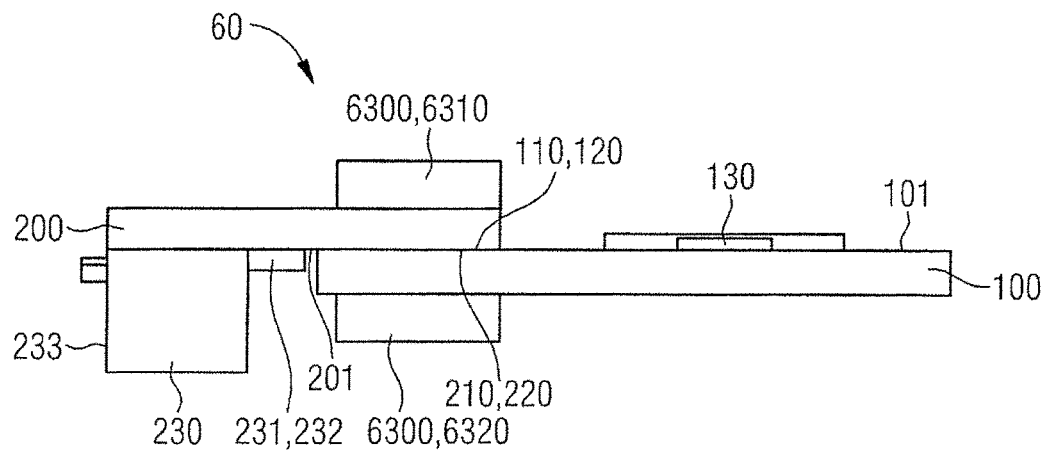
FIG. 12 shows a side view of a sixth optoelectronic arrangement with a fourth fastener.

FIG. 12 shows a schematic side view of a sixth optoelectronic arrangement 60. The sixth optoelectronic arrangement 60 has correspondences with the first optoelectronic arrangement 10 of FIGS. 1 to 4. Components of the sixth optoelectronic arrangement 60 corresponding to components present in the first optoelectronic arrangement 10 are provided with the same references in FIG. 12 as in FIGS. 1 to 4 and will not be described again in detail below. Only the differences between the sixth optoelectronic arrangement 60 and the first optoelectronic arrangement 10 will be explained below.

The sixth optoelectronic arrangement 60 has a fourth fastening means 6300 that replaces the first fastening means 300 and is intended to connect the first component circuit board 100 to the first connection circuit board 200 of the sixth optoelectronic arrangement 60. The fourth fastening means 6300 is a clamp connection, and comprises a first clamp jaw 6310 and a second clamp jaw 6320. The first component circuit board 100 and the first connection circuit board 200 of the sixth optoelectronic arrangement 60 are held between the first clamp jaw 6310 and the second clamp jaw 6320 of the fourth fastening means 6300 and pressed against one another by the clamp jaws 6310, 6320. Preferably, the first component circuit board 100 and the first connection circuit board 200 press resiliently flexibly against one another by the clamp jaws 6310, 6320 of the fourth fastening means 6300 so that thermal thickness variations of the first component circuit board 100 and of the first connection circuit board 200 can be compensated for.

The first bore 140 and the second bore 150 of the first component circuit board 100, and the first bore 240 and the second bore 250 of the first connection circuit board 200, may be omitted from the sixth optoelectronic arrangement 60.

The fourth fastening means 6300 of the sixth optoelectronic arrangement 60 may also be used in the second optoelectronic arrangement 20 and in the third optoelectronic arrangement 30.

Instead of the fourth fastening means 6300, the first component circuit board 100 and the first connection circuit board 200 of the sixth optoelectronic arrangement 60 can also be connected to one another by another fastening means or another fastening method. For example, the first component circuit board 100 and the first connection circuit board 200 can connect to one another by low-temperature soldering, adhesive bonding, silver sintering, shrinking on a shrink-down tube, riveting, caulking, crimping, eutectic bonding, molding a plastic around, or a press-fit connection. A corresponding fastening means or a corresponding fastening method may also be used in the second optoelectronic arrangement 20 and in the third optoelectronic arrangement 30.

Figure 13:
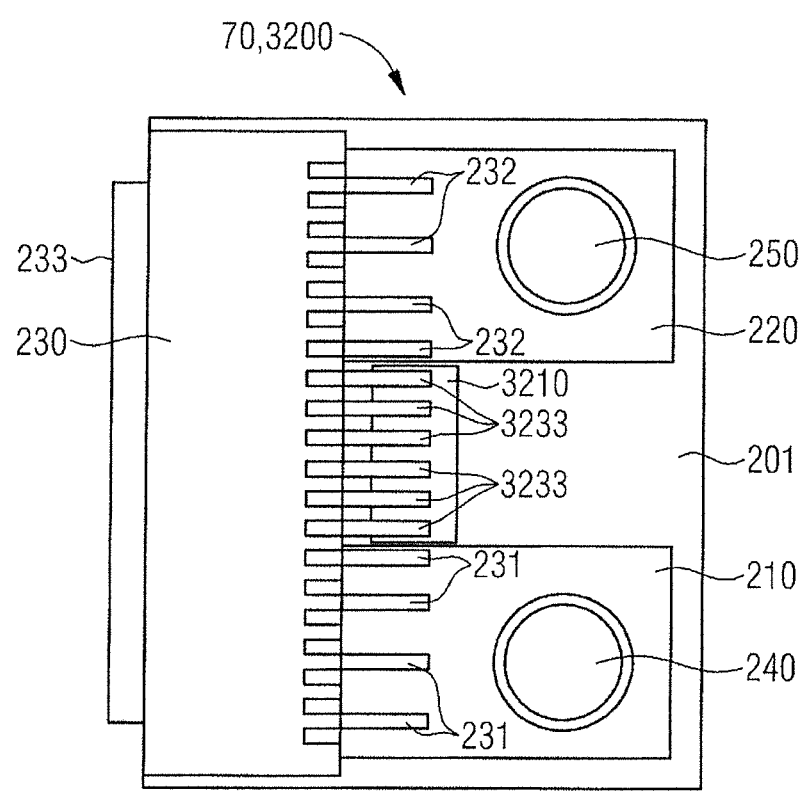
FIG. 13 shows a plan view of a fourth connection circuit board of a seventh optoelectronic arrangement.

FIG. 13 shows a schematic plan view of a fourth connection circuit board 3200 of a seventh optoelectronic arrangement 70. The seventh optoelectronic arrangement 70 has correspondences with the first optoelectronic arrangement 10. Components of the seventh optoelectronic arrangement 70 corresponding to components present in the first optoelectronic arrangement 10 are provided with the same references in FIG. 13 as in FIGS. 1 to 4, and will not be described again in detail below. Only the differences between the seventh optoelectronic arrangement 70 and the first optoelectronic arrangement 10 will be presented below.

The fourth connection circuit board 3200 of the seventh optoelectronic arrangement 70 replaces the first connection circuit board 200 of the first optoelectronic arrangement 10. Besides the components also present in the first connection circuit board 200, a further element 3210 is arranged on the surface 201 of the fourth connection circuit board 3200. The further element 3210 connects to third electrical connection elements 3233 of the electrical connector 230 of the fourth connection circuit board 3200, and can therefore be electrically contacted via the electrical connector 230.

The further element 3210 of the fourth connection circuit board 3200 may be configured as drive electronics that drive the optoelectronic semiconductor chip 130 of the first component circuit board 100 of the seventh optoelectronic arrangement 70, a protective circuit that protects the optoelectronic semiconductor chip 130 of the first component circuit board 100 of the seventh optoelectronic arrangement 70, a monitoring circuit that electrically or thermally monitors the optoelectronic semiconductor chip 30 of the first component circuit board 100 of the seventh optoelectronic arrangement 70, a monitor circuit that records a history of the optoelectronic semiconductor chip 130 or an encoding element that encodes, for example, a color locus, brightness, spectral distribution or temperature excursion of the optoelectronic semiconductor chip 130 of the first component circuit board 100 of the seventh optoelectronic arrangement 70. If the further element 3210 of the fourth connection circuit board 3200 is configured as a monitor circuit, then the further element 3210 may, for example, be used to record a number of operating hours of the optoelectronic semiconductor chip 130, or to record a temperature excursion.

The second connection circuit board 1200 of FIG. 5 and the third connection circuit board 2200 of FIG. 9 may, like the fourth connection circuit board 3200, also be equipped with a further element 3210.

Our arrangements have been illustrated and described in detail with the aid of the preferred examples. This disclosure is nevertheless not restricted to the examples disclosed. Rather, other variants may be derived therefrom by those skilled in the art, without departing from the protective scope of this disclosure or the appended claims.

This application claims priority of DE 10 2013 211 640.3, the disclosure of which is incorporated herein by reference.

The invention claimed is:

1. An optoelectronic arrangement comprising a first circuit board, a second circuit board, and an optoelectronic semiconductor chip arranged on the first circuit board,
   wherein a first electrical contact surface and a second electrical contact surface are formed on a surface of the first circuit board,
   a first mating contact surface and a second mating contact surface are formed on a surface of the second circuit board, and
   the first circuit board and the second circuit board connect to one another such that
   the surface of the first circuit board faces toward the surface of the second circuit board,
   the first mating contact surface electrically conductively connects to the first contact surface and the second mating contact surface electrically conductively connects to the second contact surface,
   the second circuit board comprises an electrical connector, and
   an electrical connection element of the electrical connector electrically conductively connects to the first mating contact surface.

2. The optoelectronic arrangement as claimed in claim 1, wherein the electrical connector is a jack connector, an insulation piercing connection device, a screw contact or a solder pin.

3. The optoelectronic arrangement as claimed in claim 1,
   wherein the second circuit board comprises a first solder contact surface electrically conductively connected to the first mating contact surface, and
   comprises a second solder contact surface electrically conductively connected to the second mating contact surface.

4. The optoelectronic arrangement as claimed in claim 1, wherein the first circuit board and the second circuit board connect to one another by a resiliently flexible fastener.

5. The optoelectronic arrangement as claimed in claim 1, wherein the first circuit board and the second circuit board connect to one another by a screw connection.

6. The optoelectronic arrangement as claimed in claim 1, wherein the first circuit board and the second circuit board connect to one another by a clamp connection.

7. The optoelectronic arrangement as claimed in claim 1, wherein the first electrical mating contact surface presses against the first electrical contact surface, and the second electrical mating contact surface presses against the second electrical contact surface when the second circuit board and the first circuit board connect to one another.

8. The optoelectronic arrangement as claimed in claim 1, wherein the optoelectronic arrangement comprises an electrically conductive element arranged between the first mating contact surface and the first contact surface and/or between the second mating contact surface and the second contact surface, when the second circuit board and the first circuit board connect to one another.

9. The optoelectronic arrangement as claimed in claim 1, wherein the first contact surface, the second contact surface, the first mating contact surface and/or the second mating contact surface comprise a ductile material.

10. The optoelectronic arrangement as claimed in claim 1, wherein the first circuit board comprises a slot arranged between the first contact surface and the second contact surface, and/or the second circuit board comprises a slot arranged between the first mating contact surface and the second mating contact surface.

11. The optoelectronic arrangement as claimed in claim 1, wherein the first circuit board comprises a third electrical contact surface,
the second circuit board comprises a third electrical mating contact surface, and
the first circuit board and the second circuit board connect to one another such that the third mating contact surface electrically conductively connects to the third contact surface.

12. The optoelectronic arrangement as claimed in claim 1, wherein the first circuit board is a metal core circuit board.

13. The optoelectronic arrangement as claimed in claim 1, wherein the second circuit board is an FR4 circuit board.

14. The optoelectronic arrangement as claimed in claim 1, wherein a further element configured as a thermocouple, an NTC thermistor, an element that measures brightness, an encoding element, or a further optoelectronic semiconductor chip is arranged on the first circuit board.

15. The optoelectronic arrangement as claimed in claim 11, wherein the third electrical contact surface electrically conductively connects to the further element.

16. The optoelectronic arrangement as claimed in claim 1, wherein the first electrical contact surface and the second electrical contact surface electrically conductively connect to the optoelectronic semiconductor chip.

17. The optoelectronic arrangement as claimed in claim 1, wherein a further element comprising drive electronics that drive the optoelectronic semiconductor chip, a protective circuit that protects the optoelectronic semiconductor chip, a monitoring circuit that electrically or thermally monitors the optoelectronic semiconductor chip, a monitor circuit that records a history of the optoelectronic semiconductor chip, and/or an encoding element, is arranged on the second circuit board.

18. An optoelectronic arrangement comprising a first circuit board, a second circuit board, and an optoelectronic semiconductor chip arranged on the first circuit board,
wherein a first electrical contact surface and a second electrical contact surface are formed on a surface of the first circuit board,
the first electrical contact surface and the second electrical contact surface electrically conductively connect to the optoelectronic semiconductor chip,
a first mating contact surface and a second mating contact surface are formed on a surface of the second circuit board,
the second circuit board comprises an electrical connector,
an electrical connection element of the electrical connector electrically conductively connects to the first mating contact surface, and
the first circuit board and the second circuit board connect to one another such that
the surface of the first circuit board faces toward the surface of the second circuit board, and
the first mating contact surface electrically conductively connects to the first contact surface and the second mating contact surface electrically conductively connects to the second contact surface.

* * * * *